United States Patent
Chauhan et al.

(10) Patent No.: US 7,902,885 B2
(45) Date of Patent: Mar. 8, 2011

(54) COMPENSATED OUTPUT BUFFER FOR IMPROVING SLEW CONTROL RATE

(75) Inventors: Vijender Singh Chauhan, Delhi (IN); Kallol Chatterjee, West Bengal (IN); Paras Garg, Uttar Pradesh (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 12/006,091

(22) Filed: Dec. 28, 2007

(65) Prior Publication Data

US 2009/0091358 A1 Apr. 9, 2009

(30) Foreign Application Priority Data

Dec. 28, 2006 (IN) ............... 2818/DEL/2006

(51) Int. Cl.
 *H03B 19/00* (2006.01)
(52) U.S. Cl. .......................... 327/117; 327/112
(58) Field of Classification Search .......... 327/112, 327/117
See application file for complete search history.

(56) References Cited

U.S. PATENT DOCUMENTS

| | | | | |
|---|---|---|---|---|
| 5,640,122 A * | 6/1997 | McClure | ...... | 327/530 |
| 5,841,296 A * | 11/1998 | Churcher et al. | ...... | 326/49 |
| 6,034,548 A * | 3/2000 | Churcher et al. | ...... | 326/49 |
| 6,075,379 A * | 6/2000 | Haider et al. | ...... | 326/21 |
| 6,133,751 A * | 10/2000 | Churcher et al. | ...... | 326/49 |
| 6,154,059 A * | 11/2000 | Cheung et al. | ...... | 326/83 |
| 6,239,616 B1 * | 5/2001 | Churcher et al. | ...... | 326/49 |
| 6,417,708 B1 * | 7/2002 | Fiedler | ...... | 327/170 |
| 6,441,653 B1 * | 8/2002 | Spurlin | ...... | 327/108 |
| 6,477,592 B1 * | 11/2002 | Chen et al. | ...... | 710/52 |
| 6,489,807 B2 * | 12/2002 | Genna et al. | ...... | 326/56 |
| 6,847,560 B2 * | 1/2005 | Pan | ...... | 365/189.05 |
| 7,336,109 B2 * | 2/2008 | Lambrache | ...... | 327/112 |
| 7,339,409 B2 * | 3/2008 | Choi et al. | ...... | 327/170 |
| 7,443,212 B2 * | 10/2008 | Hayashi et al. | ...... | 327/108 |
| 7,521,975 B2 * | 4/2009 | Biesterfeldt et al. | ...... | 327/170 |
| 7,565,468 B2 * | 7/2009 | Horowitz et al. | ...... | 710/104 |
| 2002/0093082 A1 * | 7/2002 | Miyamoto et al. | ...... | 257/678 |
| 2007/0103209 A1 * | 5/2007 | Lee | ...... | 327/112 |
| 2007/0257719 A1 * | 11/2007 | Hargan | ...... | 327/170 |
| 2008/0106297 A1 * | 5/2008 | Jao | ...... | 326/27 |
| 2008/0211548 A1 * | 9/2008 | Hayashi et al. | ...... | 327/108 |
| 2008/0315929 A1 * | 12/2008 | Mnich | ...... | 327/175 |
| 2009/0067239 A1 * | 3/2009 | Tran et al. | ...... | 365/185.03 |
| 2009/0168549 A1 * | 7/2009 | Jeon | ...... | 365/189.05 |

* cited by examiner

*Primary Examiner* — Lincoln Donovan
*Assistant Examiner* — Adam D Houston

(57) ABSTRACT

The disclosure relates a compensated output buffer circuit providing an improved slew rate control and a method for minimizing the variations in the current slew rate of the buffer over process, voltage and temperature (PVT) conditions. The output buffer circuit includes a split-gate compensated driver and a slew rate control circuit. Accordingly, a desired slew rate can be maintained with fewer variations over wide range of variations in PVT conditions.

26 Claims, 12 Drawing Sheets

COMPENSATED OUTPUT BUFFER FOR IMPROVING SLEW CONTROL RATE

CROSS-REFERENCE TO RELATED APPLICATIONS

The present application is related to Indian Patent Application No. 2818/Del/2006, filed Dec. 28, 2006, entitled "A COMPENSATED OUTPUT BUFFER FOR IMPROVING SLEW CONTROL RATE". Indian Patent Application No. 2818/Del/2006 is assigned to the assignee of the present application and is hereby incorporated by reference into the present disclosure as if fully set forth herein. The present application hereby claims priority under 35 U.S.C. §119(a) to Indian Patent Application No. 2818/Del/2006.

TECHNICAL FIELD

The present invention relates to the field of input/output (I/O) systems in the semiconductor technology. In particular, the invention discloses an output buffer system having very less current slew rate variations over varied process, voltage and temperature (PVT) conditions.

BACKGROUND

In semiconductor integrated circuits, output buffer circuits are generally used to output an internal data via an output terminal such as, an output pad. As the interface grows up, output drivers have been an important component for high quality signals integrity, because the output voltage levels and a slew rate are mainly determined by the output drivers.

The operating characteristics of CMOS transistors, from which the drivers are constructed, change under a variety of conditions, often referred to as process, voltage and temperature (PVT) variations. The PVT variations may be conceptualized as a box across, which the operating characteristics of the transistors move. For example, the operating characteristics may move from a fastest corner of the PVT variations to a slowest corner of the PVT variations, and everywhere in between. If inadequate compensation is made for these variations, an output slew rate may vary substantially within a particular driver as well as from a driver to a driver on a chip.

To achieve good signal integrity, the variations in an output current slew rate must be minimized over the PVT variations. A large slew rate induces much switching noise, (L*di/dt) noise, and a small slew rate decrease the signal timing margin. In a conventional output slew rate control scheme, a pre-driver is set to a fixed value, so the time constant (RC) of a pre-driver node determines the output slew rate. But, if PVT conditions vary, the time constant becomes different, so the slew rate goes far from its optimal values.

FIG. 1 describes a schematic circuit diagram of a conventional split-gate output driver. The output buffer includes a pull-up PMOS transistor P11 and a pull-down NMOS transistor N11; two pre-driver sections (slew rate control sections) to individually control each driver's transistor during output transitions viz. a first inverter 104 that inverts an output data A, applies an inverted output data to a gate of the pull-up transistor P11, and controls the pull-up slew rate of an output driver 102; and a second inverter 106 that applies the inverted output data to a gate of the pull-down transistor N11, and controls the pull-down slew rate of the output driver 102.

In the output buffer circuit of the FIG. 1, the pull-up slew rate of the output driver 102 is determined based on a current flow charging the load capacitance of an output terminal PAD through the pull-up transistor P11 and the fall time of the pre-driver node PD, which in turn is controlled by a current of the NMOS transistor N12. Similarly, the pull-down slew rate of the output driver 102 is determined based on a current flow discharging the load capacitance of an output terminal PAD through the pull-down transistor N11 and the fall time of the pre-driver node ND, which in turn is controlled by the current of PMOS transistor P13.

These currents, which affect the slew rate of the output driver 102 varies considerably in the presence of PVT variations on a chip. Accordingly, the slew rate of the output driver 102 also varies considerably in the presence of PVT variations. The conventional output buffer circuit as, explained in the FIG. 1, it is difficult to maintain the slew rate within a narrow tolerance under conditions in which the PVT may vary.

Therefore, there is a need for a novel circuit and method for providing an improved slew rate control over process, voltage and temperature (PVT) conditions.

SUMMARY

It is an object of the present invention to provide a compensated output buffer for minimizing the variations in a current slew rate over process, voltage and temperature (PVT) conditions.

It is another object of the present invention to provide a compensated output buffer for maintaining the variation of the slew rate within a narrow band even for skewed process corners i.e. fast n-slow p and slow n-fast p.

To achieve the aforementioned objective, the present invention provides a compensated output buffer circuit providing an improved slew rate control comprising:

a compensated output driver utilizing a separate compensation codes for PMOS transistors and NMOS transistors, said compensated output driver coupled to a first driving node, a second driving node and an output node, the compensated output driver having a pull-up driver section for driving said output node in response to a signal at the first driving node and a pull down driver section for driving said output node in response to a signal at the second driving node;

a compensated pull-up slew rate controller utilizing a separate compensation codes for PMOS transistors and NMOS transistors, said compensated pull-up slew rate controller connected between an input node and the compensated output driver through the first driving node for controlling a pull-up slew rate of the compensated output driver during a transition of an output from 0 to 1; and a compensated pull-down slew rate controller utilizing a separate compensation codes for PMOS transistors and NMOS transistors, said compensated pull-down slew rate controller connected between the input node and the compensated output driver through the second driving node for controlling a pull-down slew rate of the compensated output driver during a transition of the output from 1 to 0 to minimize the variations in the current slew rate of the output buffer over process, voltage and temperature condition for improving the slew rate control.

Further the present invention provides a compensated output buffer circuit providing an improved slew rate control comprising:

a compensated output driver utilizing a separate compensation codes for PMOS transistors and NMOS transistors, said compensated output driver coupled to a first driving node, a second driving node and an output node, the compensated output driver having a pull-up driver section for driving said output node in response to a signal at the first driving node and a pull down driver section for driving said output node in response to a signal at the second driving node;

a compensated pull-up slew rate controller utilizing a separate compensation codes for PMOS transistors and NMOS transistors, said compensated pull-up slew rate controller controlling a pull-up slew rate of the compensated output driver comprising:

an inverter circuit coupled between an input node and the first driving node for inverting data of the input node and outputting an inverted data to the first driving node, the inverter circuit comprising a first PMOS transistor and a first NMOS transistor;

a first control signal generator coupled to the input node for generating a first control signal;

a second NMOS transistor operatively coupled between a first node and a ground voltage for switching, said second NMOS transistor being controlled by the first control signal;

a third NMOS transistor connected parallel to the second NMOS transistor, said third NMOS transistor operatively coupled between the first node and the ground voltage for discharging a parasitic capacitance developed at the first driving node;

a fourth NMOS diode transistor operatively coupled between a second node and the ground voltage;

means for generating a first current mirror for providing a proportionate current to a first slew rate control path;

a second PMOS transistor connected between the second node and a third node for switching, said second PMOS transistor being controlled by the first control signal; and a PMOS module coupled between a power supply and the third node, said module comprising a plurality of PMOS transistors for controlling a current in a slew rate control path formed by the first NMOS transistor and the third NMOS transistor;

a compensated pull-down slew rate controller utilizing a separate compensation codes for PMOS transistors and NMOS transistors, said compensated pull-down slew rate controller controlling a pull-down slew rate of the compensated output driver comprising:

an inverter circuit coupled between the input node and the second driving node for inverting data of the input node and outputting an inverted data to the second driving node, said inverter comprising a third PMOS transistor and a fifth NMOS transistor;

a second control signal generator coupled to the input node for generating a second control signal;

a fourth PMOS transistor connected between the power supply and a fourth node for switching, said fourth PMOS transistor being controlled by the second control signal;

a fifth PMOS transistor connected parallel to the fourth PMOS transistor, said fifth PMOS transistor operatively coupled between the power supply and the fourth node for charging a parasitic capacitance at the second driving node;

a sixth PMOS diode transistor connected between the power supply and a fifth node;

means for generating a second current mirror for providing a proportionate current to a second slew rate control path;

a sixth NMOS transistor connected between the fifth node and a sixth node for switching, said sixth NMOS transistor being controlled by the second control signal; and an NMOS module coupled between the sixth node and the ground voltage, said NMOS module comprising a plurality of NMOS transistors for controlling a current in a slew rate control path formed by the third PMOS transistor and the fifth PMOS transistor for improving the slew rate control.

Further the present invention provides a method for minimizing slew rate variations through a compensated output buffer circuit, said output buffer comprising a pull-up slew rate controller, a pull-down slew rate controller and a compensated output driver, said method comprising controlling a current generated in a slew rate control path through a separate compensation codes for PMOS transistors and NMOS transistors that control a plurality of transistors in said pull-up slew rate controller and said pull-down slew rate controller for minimizing slew rate variations.

The drawbacks and disadvantages are addressed by an output buffer for buffering the data while minimizing an output current slew rate variations caused by PVT variations. Accordingly, the output buffer, usable in a semiconductor integrated circuit, is provided to minimize the variations in the current slew rate of the buffer over process, voltage and temperature (PVT) conditions, which includes within the buffer a split-gate compensated driver and a slew rate control circuit. Accordingly, a desired slew rate can be maintained with fewer variations over wide range of variations in PVT conditions. The present slew rate control circuit consists of two separate slew rate control circuits for a pull-up PMOS driver and a pull-down NMOS driver. To minimize the variations in the slew rate, the rising and falling time of the pre-driver nodes are controlled by means of two current control networks, which are compensated against PVT variations by using separate NMOS and PMOS digital compensation codes. The compensation codes are provided by a compensation circuit, which sense the variation in the PVT conditions and reflect these variations in the form of separate compensation codes for NMOS and PMOS transistors. In the current control network for PMOS (NMOS) driver, the current is controlled only by PMOS (NMOS) transistors, which enables the circuit to reduce the slew rate variation effectively on skewed process corners i.e. fast n-slow p and slow n-fast p.

Other technical features may be readily apparent to one skilled in the art from the following figures, descriptions and claims.

BRIEF DESCRIPTION OF THE DRAWINGS

For a more complete understanding of this present disclosure and its features, reference is now made to the following description, taken in conjunction with the accompanying drawings, in which.

DETAILED DESCRIPTION

Figure 1:
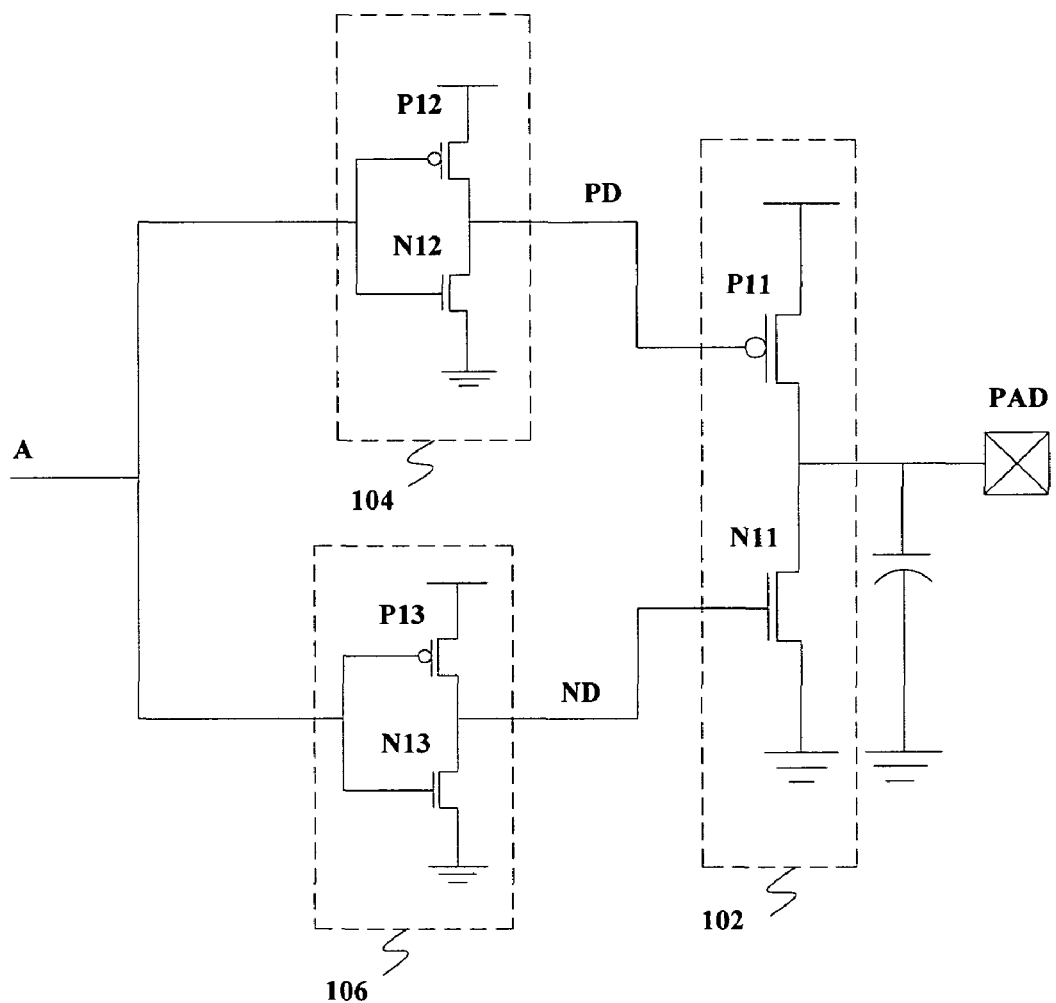
FIG. 1 illustrates a schematic circuit diagram for a conventional split-gate output buffer circuit.

The preferred embodiments of the present invention will be described in detail with reference to the accompanying drawings. However, the present invention is not limited to the preferred embodiments. The present invention can be modified in various forms. The preferred embodiments of the present invention are only provided to explain more clearly the present invention to the ordinarily skilled in the art of the present invention. In the accompanying drawings, like reference numerals are used to indicate like components.

The present invention provides a compensated output buffer circuit having an improved slew rate control.

Figure 2:
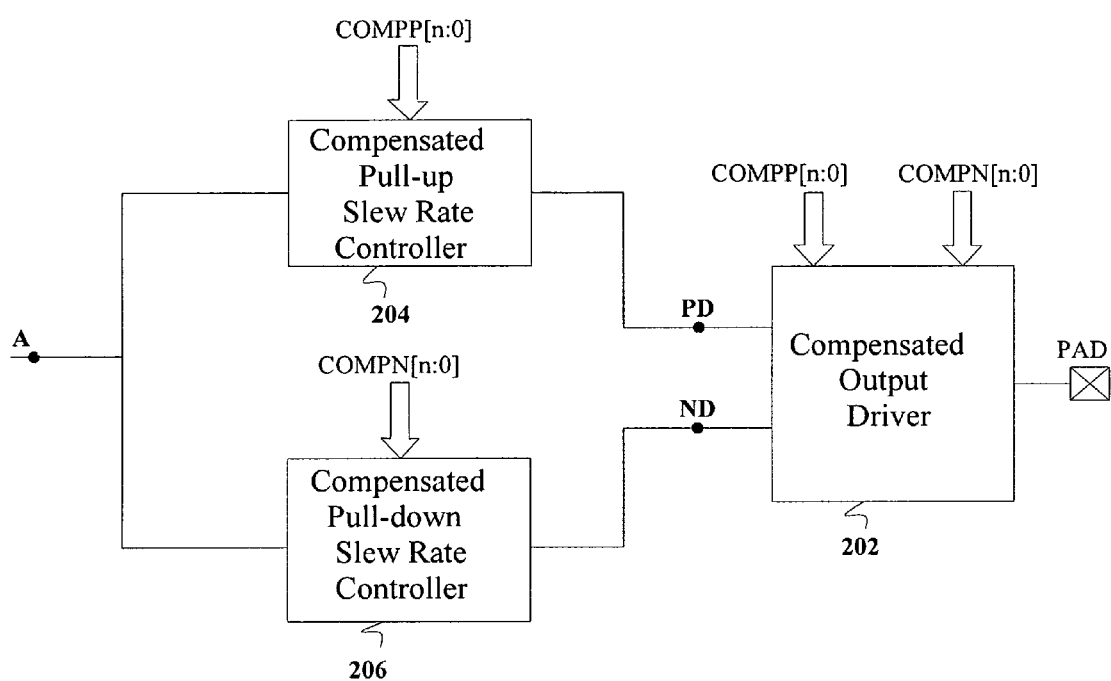
FIG. 2 illustrates a schematic block diagram for an output buffer circuit according to an embodiment of the present disclosure.

FIG. 2 illustrates a schematic block diagram of an output buffer circuit according to an embodiment of the present invention. The output buffer circuit includes a compensated output driver 202, a compensated pull-up slew rate controller 204 and a compensated pull-down slew rate controller 206.

The compensated output driver 202 is connected between a first driving node PD and a second driving node ND and an output node PAD. The compensated output driver 202 drives a load capacitance $C_L$ in response to signals at nodes PD and ND. The compensated output driver 202 consists of a pull-up driver section and a pull-down driver section. The pull-up driver drives the output node PAD in response to a signal at the node PD and the pull-down driver section drives the output node PAD in response to a signal at the node ND. The compensation codes COMPP [n:0] and COMPN [n:0] are used to compensate current driving capability of the output driver 202 against PVT variations.

The compensated pull-up slew rate controller 204 is connected between nodes A and the node PD, the driving node for the pull-up driver. The compensated pull-up slew rate controller 204 controls the pull-up slew rate of the output driver 202, when output makes a transition from 0 to 1. The compensation codes COMPP [n: 0] are used to generate control signals in the pull-up slew rate controller 204.

The compensated pull-down slew rate controller 206 is connected between nodes A and the node ND, the driving node for pull-down driver. The compensated pull-down slew rate controller 206 controls the pull-down slew rate of the output driver 202 when output makes a transition from 1 to 0. The compensation codes COMPN [n: 0] are used to generate control signals in the pull-down slew rate controller 206.

Figure 3:
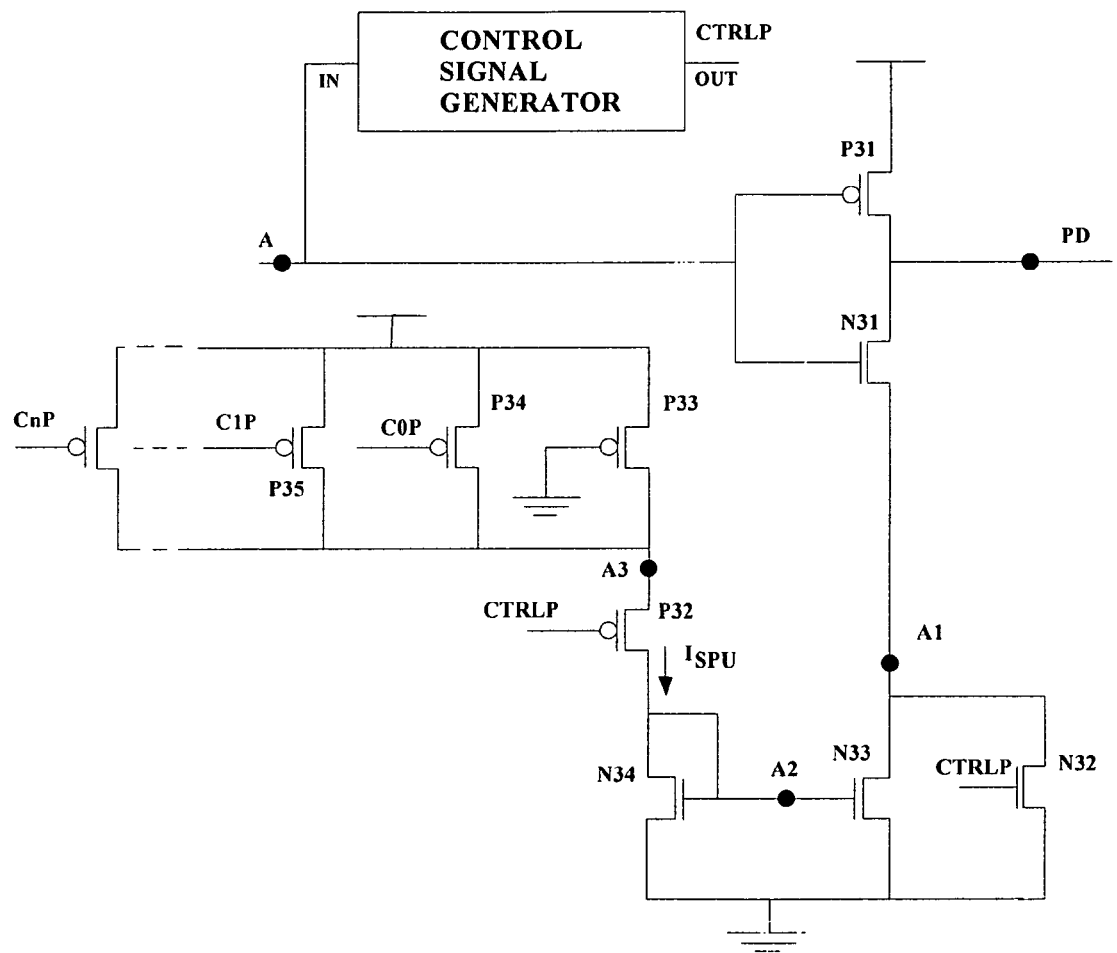
FIG. 3 illustrates schematic circuit diagram for the generic compensated pull-up slew rate controller of FIG. 2.

FIG. 3 illustrates the schematic circuit diagram of a generic compensated pull-up slew rate controller described in FIG. 2.

The compensated pull-up slew rate controller 204 includes an inverter circuit coupled between an input node A and the first driving node PD for inverting data of the input node A and outputting an inverted data at the first driving node PD, a first control signal generator coupled at the input node A having a NAND gate configured to receive complementary inputs for generating a first control signal CTRLP, a second NMOS transistor N32 connected between a first node A1 and a ground voltage to act as a switch and is controlled by the first control signal CTRLP, a third NMOS transistor N32 connected in parallel to the second NMOS transistor N32 and is connected between the first node A1 and the ground voltage for discharging the parasitic capacitance developed at the first driving node PD through a first slew rate control path formed by a first NMOS transistor N31 and the third NMOS transistor N33, a fourth NMOS transistor N34 connected in a diode configuration between a second node A2 and the ground voltage, a second PMOS transistor P32 connected between the second node A2 and a third node A3 to act as a switch, which is controlled by the first control signal CTRLP and a PMOS module coupled between a power supply and the third node A3 for controlling the current in the first slew rate control path. The PMOS module includes multiple PMOS transistors P33, P34, - - - , P3n and their connections are shown in the FIG. 3.

The inverter of the compensated pull-up slew rate controller 204 includes a first PMOS transistor P31 and the first NMOS transistor N31. The first PMOS transistor P31 having a source terminal connected to the power supply, a drain terminal connected to the first driving node PD and a gate terminal connected to the input node A. The first NMOS transistor N31 having a drain terminal connected to the drain terminal of the first PMOS transistor P31 through the first driving node PD, a source terminal connected to the first node A1 and a gate terminal connected to the gate terminal of the first PMOS transistor P31 through the input node A. The first PMOS transistor P31 is configured with the first NMOS transistor N31 in an inverter configuration.

Figure 4:
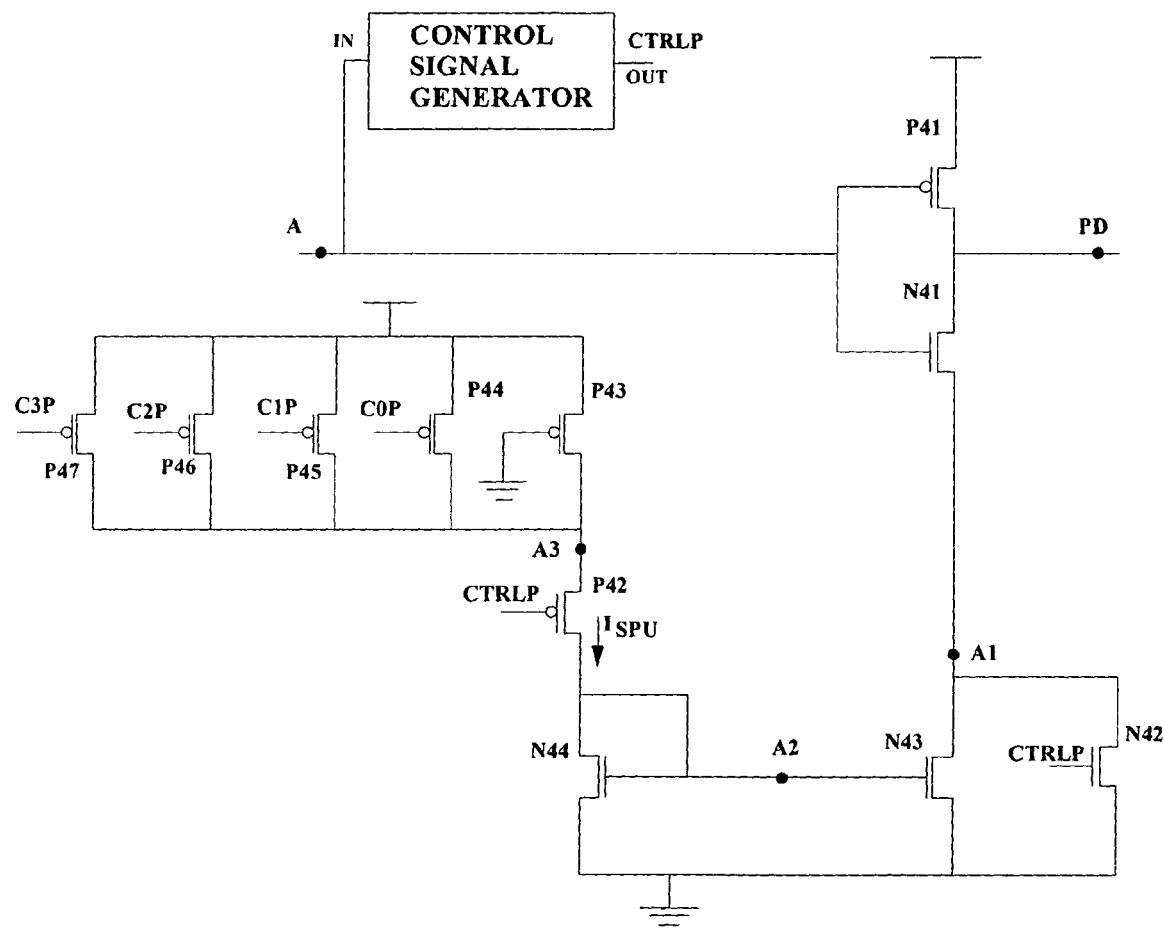
FIG. 4 illustrates schematic circuit diagram for a specific 4-bit compensated pull-up slew rate controller of FIG. 2.

FIG. 4 illustrates the schematic circuit diagram of a specific 4-bit compensated pull-up slew rate controller according to an embodiment of FIG. 3. The compensated pull-up slew rate controller implements an inverter for inverting the data at node A and outputting the inverted data to the output node PD. When a transition from 0 to 1 occurs at the node A, the parasitic capacitance (constituted mainly by a gate capacitance of pull-up driver section) at a pre-driver node PD is discharged through the first slew rate control path formed by NMOS transistors N41 and N43. The current in this path is controlled by PMOS transistors P43 through P47. The NMOS transistors N43 and N44 constitute a first current mirror and copies a current $I_{SPU}$ to the first slew rate control path. The value of the current $I_{SPU}$ is controlled by the PMOS transistors P43 through P47. The PMOS transistor P43 is always "ON", while the PMOS transistors P44 through P47 are gate-controlled by the control signals C3P through C0P. The control signals C3P through C0P are derived by simply inverting compensation codes COMPP3 through COMPP0 through inverters 41 through 44. These compensation codes COMPP [3:0] are provided by a compensation circuit, which sense the variation in PVT conditions and reflect these variations in the form of separate compensation codes for NMOS and PMOS transistors. The bits of N compensation code (P compensation code) reflect the change in current characteristics of NMOS (PMOS) transistors due to changing the PVT conditions. Here, the compensation circuit has been assumed to provide 4-bits compensation codes. In general, compensation codes of n-bits can be obtained from an n-bit compensation circuit.

As the value of the compensation codes vary with change in the PVT conditions, the control signals C3P through C0P also vary with change in PVT conditions. For the best case, the bits of PMOS compensation codes are all zero i.e. COMPP [3:0] =0000 and the control signals C3P through C0P are all 1's and hence all the PMOS transistors P44 through P47 are in "OFF" state. For the worst case, the bits of PMOS compensation codes are all 1's i.e. COMPP [3:0]=1111 and the control signals C3P through C0P are all 0's and hence all the PMOS transistors P44 through P47 turn "ON", thus compensating for the loss in the current $I_{SPU}$ caused due to slowing PVT conditions and thus maintaining the slew rate variations in a narrow band.

Thus, based on the PVT conditions the PMOS transistors P44 through P47 are turned "OFF/ON" by the control signals C3P through C0P. Accordingly, the current $I_{SPU}$ is, in effect, controlled and compensated against PVT variations by changing compensation codes and hence, the slew rate is also compensated by means of the compensated current $I_{SPU}$.

There are two transistors, the NMOS transistor N42 and the PMOS transistor P42, which act as switches and their gates are controlled by the signal CTRLP. The function of the CTRLP signal is to prevent steady state consumption in the compensated pull-up slew rate controller. Whenever, a transition from 0 to 1 occurs on the node A, the CTRLP signal goes to 0, thus turning the NMOS transistor N42 "OFF" and the PMOS transistor P42 "ON". This allows the current through the slew rate control path to be controlled by the PMOS transistors P43 through P47. But, when the circuit is in a steady state, the CTRLP signal goes to 1 enabling the NMOS transistor N42 to "ON" state and turning "OFF" the PMOS transistor P42, which in turn causes the current $I_{SPU}$ to cease to 0. Thus, if the steady state value of the node A is 1, the node PD is pulled down through the current path formed by the NMOS transistors N41 and N42.

Figure 5:
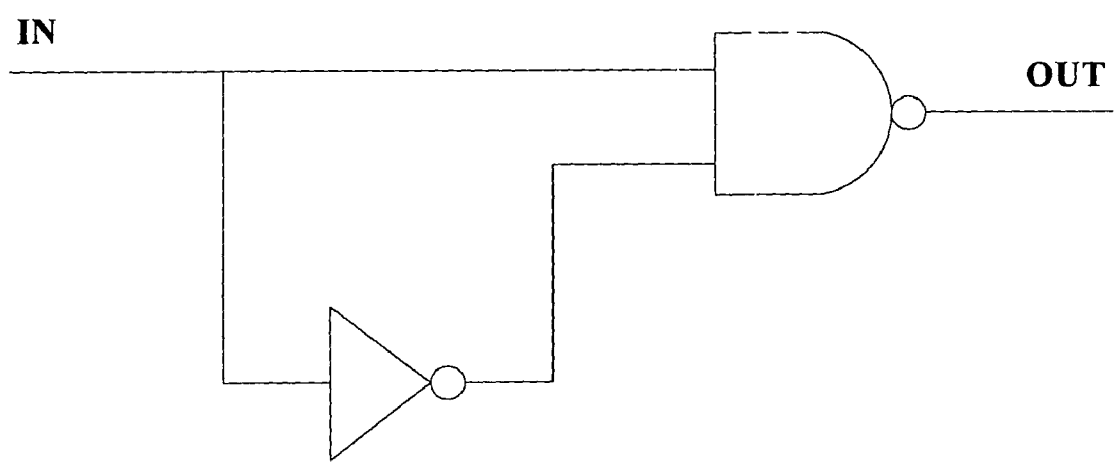
FIG. 5 illustrates the schematic circuit diagram for a control signal generator of FIG. 4.

FIG. 5 illustrates a schematic circuit diagram for the control signal generator of FIG. 4. The control signal generator generates a control signal CTRLP. The control signal generator having a NAND gate, which is configured to receive complementary inputs for generating the control signal CTRLP.

Figure 6:
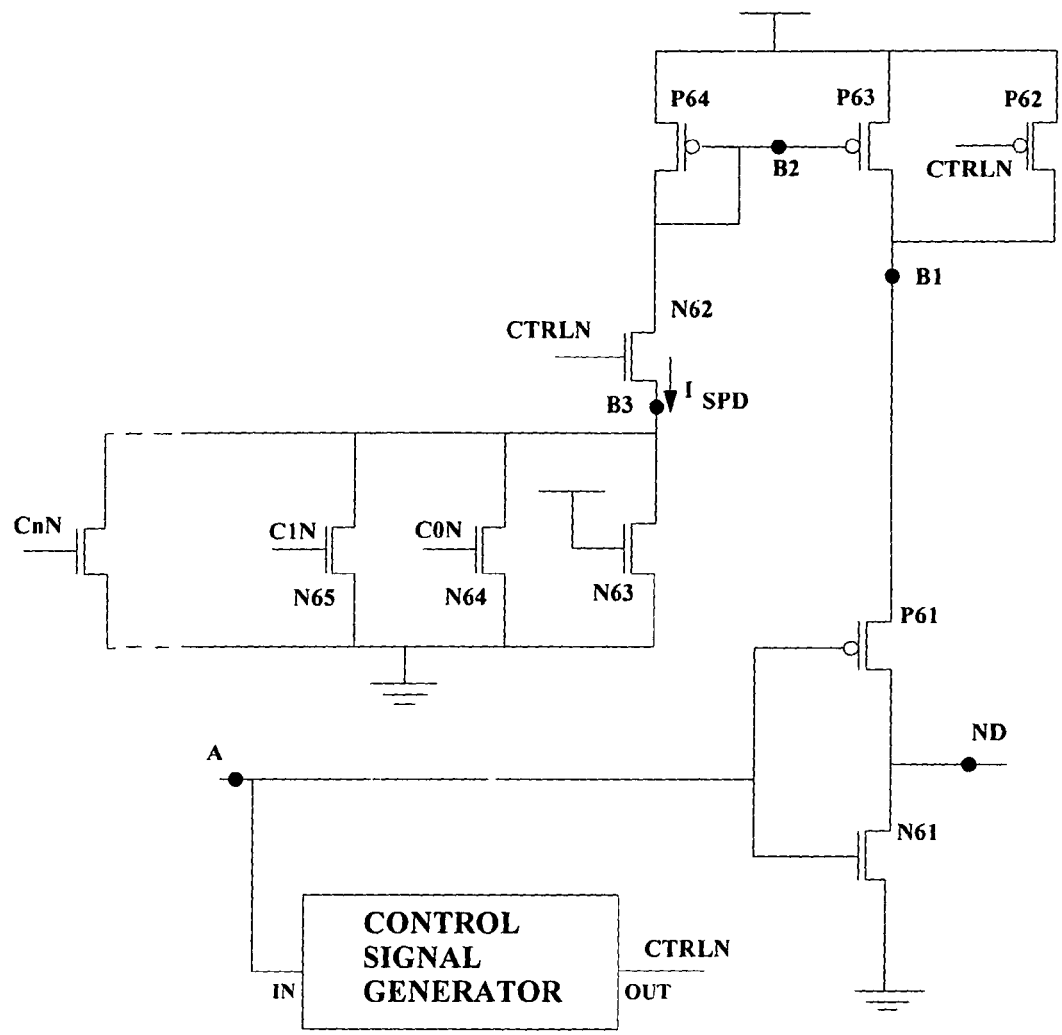
FIG. 6 illustrates a schematic circuit diagram for the generic compensated pull-down slew rate controller of FIG. 2.

FIG. 6 illustrates a schematic circuit diagram of a generic compensated pull-down slew rate controller as introduced in FIG. 2. The compensated pull-down slew rate controller 206 includes an inverter circuit coupled between an input node A and a second driving node ND for inverting data of the input node A and outputting an inverted data to the second driving node ND, a second control signal generator coupled to the input node A for generating a second control signal CTRLN, a fourth PMOS transistor P62 connected between the power supply and a fourth node B1 to act as a switch and is controlled by the second control signal CTRLN, a fifth PMOS transistor P63 coupled in parallel to the fourth PMOS transistor P62 and is connected between the power supply and the fourth node B1 for charging a parasitic capacitance at the second driving node ND through a second slew rate control path formed by a third PMOS transistor P61 and the fifth PMOS transistor P63, a sixth PMOS transistor P64 coupled in a diode configuration connected between a power supply and a fifth node B2, a sixth NMOS transistor N62 connected between the fifth node B2 and a sixth node B3 to act as a switch and is controlled by the second control signal CTRLN and an NMOS module coupled between the sixth node B3 and the ground voltage for controlling the current in the second slew rate control path, which in turn minimize the variations in the current slew rate of the output buffer over process, voltage and temperature condition. The NMOS module includes multiple NMOS transistors and their connections are shown in the FIG. 6.

The inverter of the compensated pull-down slew rate controller 206 includes a third PMOS transistor P61 and a fifth NMOS transistor N61. The third PMOS transistor P61 having a source terminal connected to the fourth node B1, a drain terminal connected to the second driving node ND and a gate terminal connected to the input node A. The fifth NMOS transistor N61 having a drain terminal connected to the drain terminal of the third PMOS transistor P61 through the second driving node ND, a source terminal connected to the ground voltage and a gate terminal connected to the gate terminal of the third PMOS transistor P61 through the input node A. The third PMOS transistor P61 configured with the fifth NMOS transistor N61 in an inverter configuration.

Figure 7:
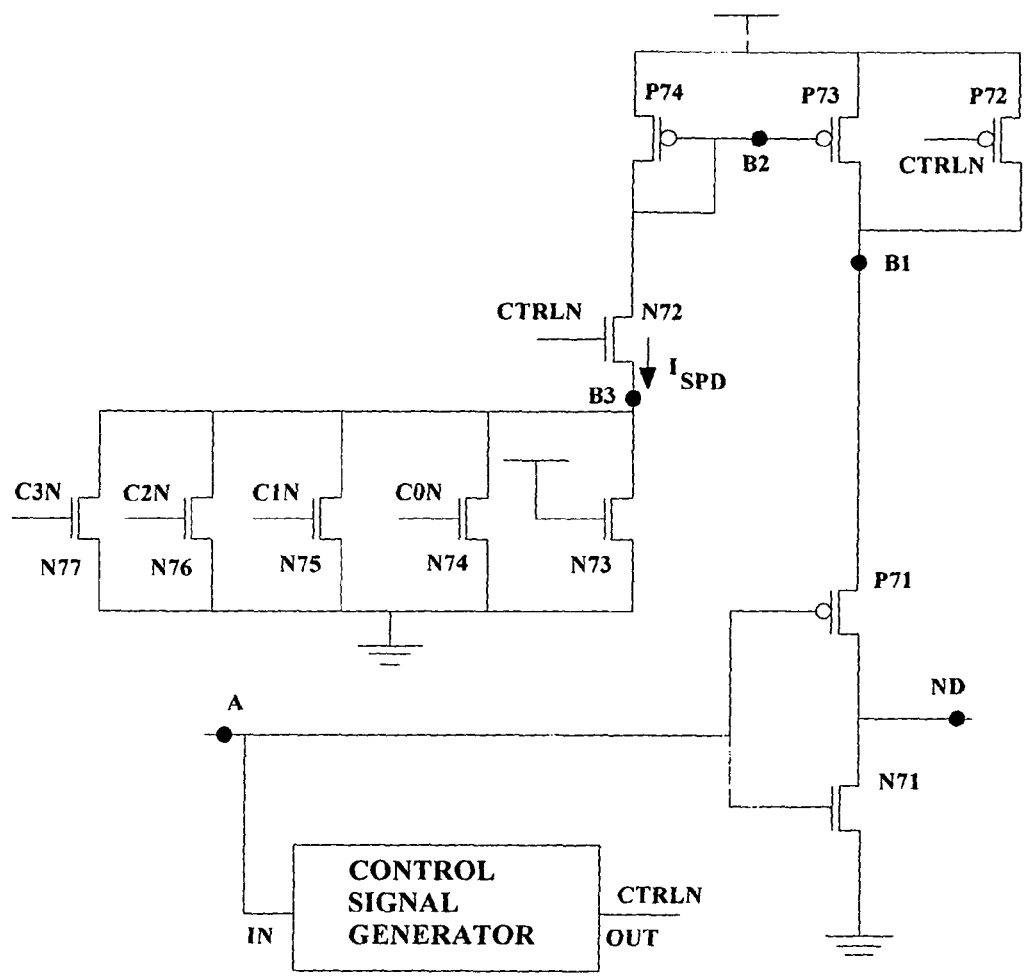
FIG. 7 illustrates a schematic circuit diagram for a specific 4-bit compensated pull-down slew rate controller of FIG. 2.

FIG. 7 illustrates a schematic circuit diagram of a specific 4-bit compensated pull-down slew rate controller according to an embodiment of FIG. 6. The compensated pull-down slew rate controller implements an inverter for inverting the data at a node A and outputting the inverted data to a node ND. When a transition from 1 to 0 occurs on the node A, a parasitic capacitance (constituted mainly by a gate capacitance of pull-down driver section) at the pre-driver node ND is charged through the second slew rate control path formed by PMOS transistors P71 and P73. The current in this path is controlled by NMOS transistors N73 through N77. The PMOS transistors P73 and P74 constitute a second current mirror and copies a current $I_{SPD}$ to the second slew rate control path. The value of the current $I_{SPD}$ is controlled by NMOS transistors N73 through N77. The NMOS transistor N73 is always "ON", while the NMOS transistors N74 through N77 have their gates controlled by control signals C3N through C0N. The control signals C3N through C0N are derived by simply buffering compensation codes COMPN3 through COMPN0 using simple buffers 71 through 74. These compensation codes COMPN [3:0] are provided by the compensation circuit, which sense the variation in the PVT conditions and reflect these variations in the form of separate compensation codes for the NMOS and PMOS transistors.

As the value of the compensation codes vary with change in the PVT conditions, the control signals C3N through C0N also vary with change in the PVT conditions. For the best case, the bits of NMOS compensation codes are all "0" i.e. COMPN [3:0]=0000 and the control signals C3N through C0N are all 0's and hence all the NMOS transistors N74 through N77 are "OFF". For the worst case, the bits of compensation codes are all 1's i.e. COMPN [3:0]=1111 and the control signals C3N through C0N are all 1's and hence all the NMOS transistors N74 through N77 turn "ON", thus compensating for the loss in the current $I_{SPD}$ caused due to slowing the PVT conditions and thus maintaining the slew rate variations in a narrow band.

Thus, based on the PVT conditions the NMOS transistors N74 through N77 are turned "OFF/ON" by the control signals C3N through C0N. Accordingly, the current $I_{SPD}$ is, in effect, controlled and compensated against PVT variations by changing compensation codes and hence, the slew rate is also compensated by means of the compensated current $I_{SPD}$.

There are two transistors, a PMOS transistor P72 and a NMOS transistor N72, which act as switches and their gates are controlled by the signal CTRLN. The function of the CTRLN signal is to prevent steady state consumption in the compensated pull-down slew rate controller. Whenever, a transition from 1 to 0 occurs on the node A, the CTRLN signal goes to 1, thus turning the PMOS transistor P72 "OFF" and NMOS transistor N72 "ON". This allows the current through the slew rate control path to be controlled by the NMOS transistors N73 through N77. But, when the circuit is in the steady state, the CTRLN signal goes to 0 enabling the PMOS transistor P72 to "ON" state and turning "OFF" the NMOS transistor N72, which in turn causes the current $I_{SPD}$ to cease to 0. Thus, if the steady state value of the node A is 0, the node ND is pulled up through the current path formed by the PMOS transistors P71 and P72.

Figure 8:
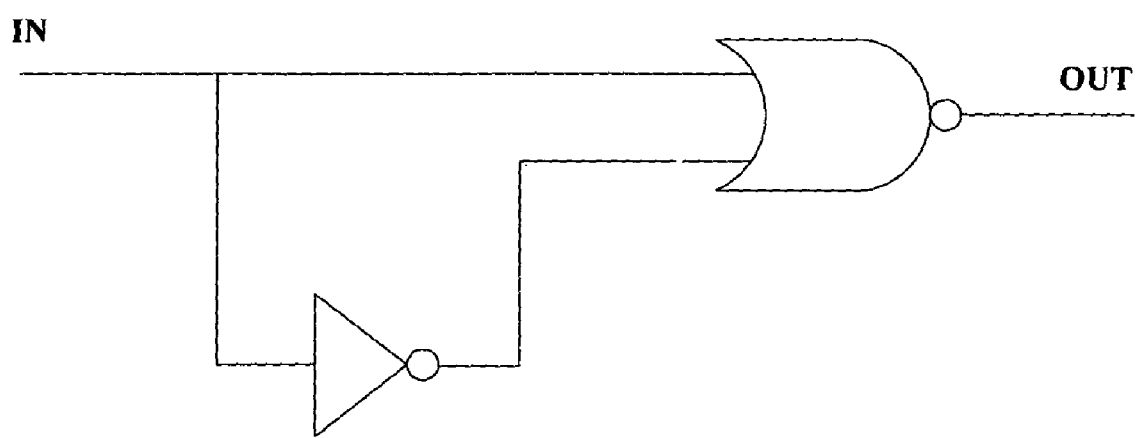
FIG. 8 illustrates a schematic circuit diagram for a control signal generator of FIG. 7.

FIG. 8 illustrates the schematic diagram for control signal generator of FIG. 7. The control signal generator generates a second control signal CTRLN. The control signal generator having a NOR gate, which is configured to receive complementary inputs for generating the second control signal.

Figure 9:
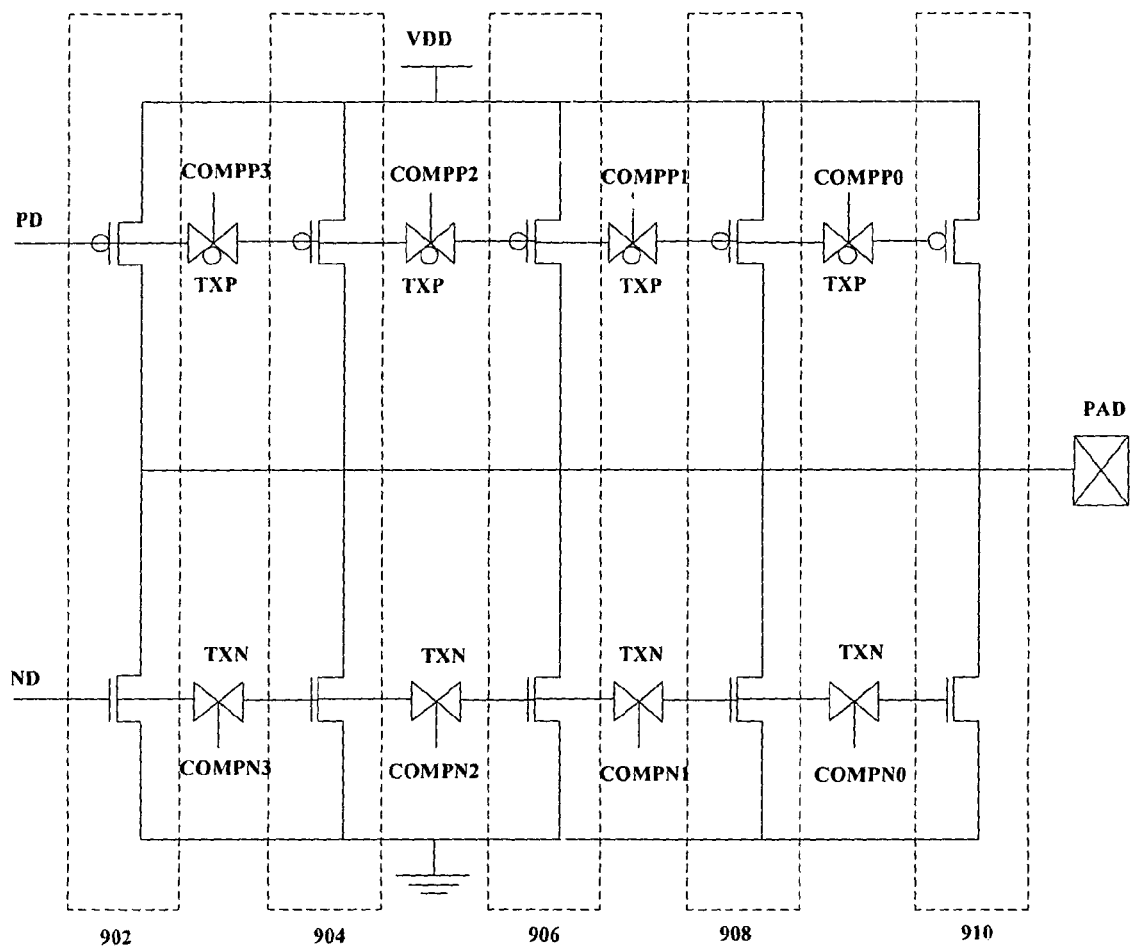
FIG. 9 illustrates a schematic circuit diagram of a preferred embodiment for a compensated output driver of FIG. 2.

FIG. 9 illustrates a schematic circuit diagram of a preferred embodiment for the compensated output driver of FIG. 2. The compensation codes COMPN [0:3] and COMPP [0:3] are used to design a variable width O/P driver, thereby controlling the current driving capability of the driver, such that the variations in current drive are minimized against PVT variations. A circuit 902 is always "ON", while a controllable circuits 904 through 910 are ON or OFF depending upon the codes COMPN [0:3] and COMPP [0:3]. For best case, only the circuit 902 is "ON", while the rest of the circuit viz. 904, 906, 908 and 910 are "OFF". As the PVT conditions move from worst to best, the controllable circuits get turning "ON" depending upon the codes COMPN [0:3] and COMPP [0:3], thus compensating against the loss in current capability due to worsening PVT conditions. For a worst case, all the circuits 902 through 910 are "ON". Thus, the loss current capability of the O/P driver is compensated over the whole PVT conditions.

In an embodiment, a design for a 4-bit compensated output buffer has been explained. In other embodiments, an n-bit compensated output buffer with the improved slew rate control can be designed with an n-bit compensated pull-up slew rate controller, an n-bit compensated pull-down slew rate controller and an n-bit compensated output driver in accordance with FIGURES provided herewith.

Figure 10:
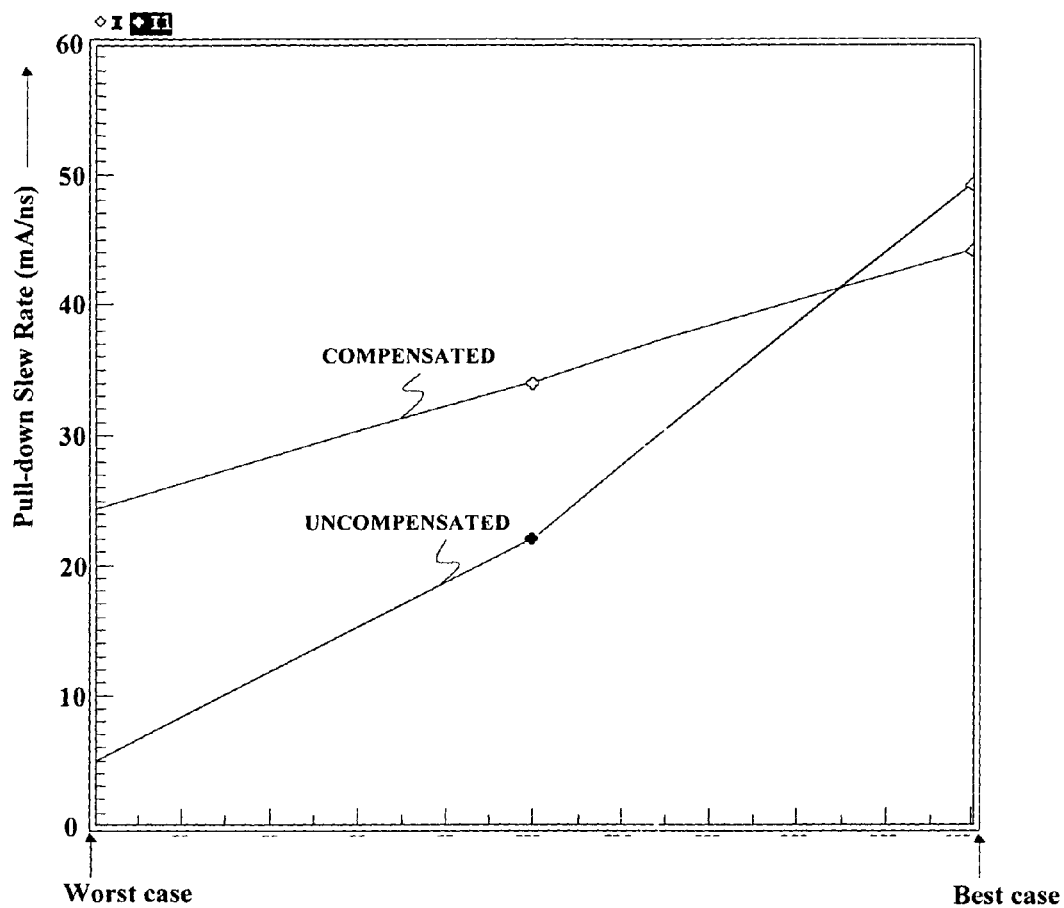
FIG. 10 illustrates a graph for the in pull-up slew rate variations for a compensated and uncompensated output buffer.

FIG. 10 illustrates the variation of pull-up slew rates for two output buffer types: a compensated output buffer designed in accordance with the present invention and an uncompensated output buffer, for example, one as shown in FIG. 1.

Figure 11:
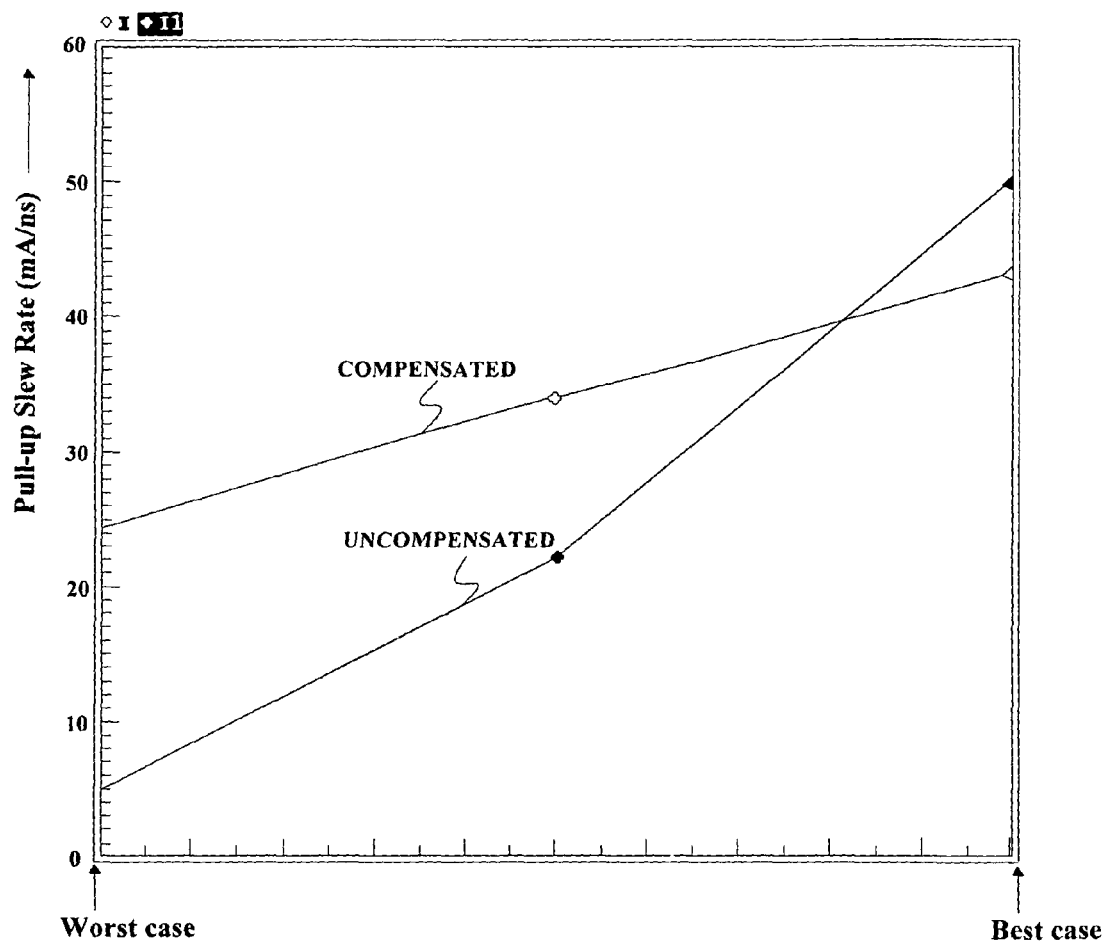
FIG. 11 illustrates a graph for variation in pull-down slew rates for the compensated and uncompensated output buffer.

FIG. 11 illustrates the variation of pull-down slew rates for two output buffer types: the compensated output buffer designed in accordance with the present invention and the uncompensated output buffer, for example, one as shown in FIG. 1.

Figure 12:
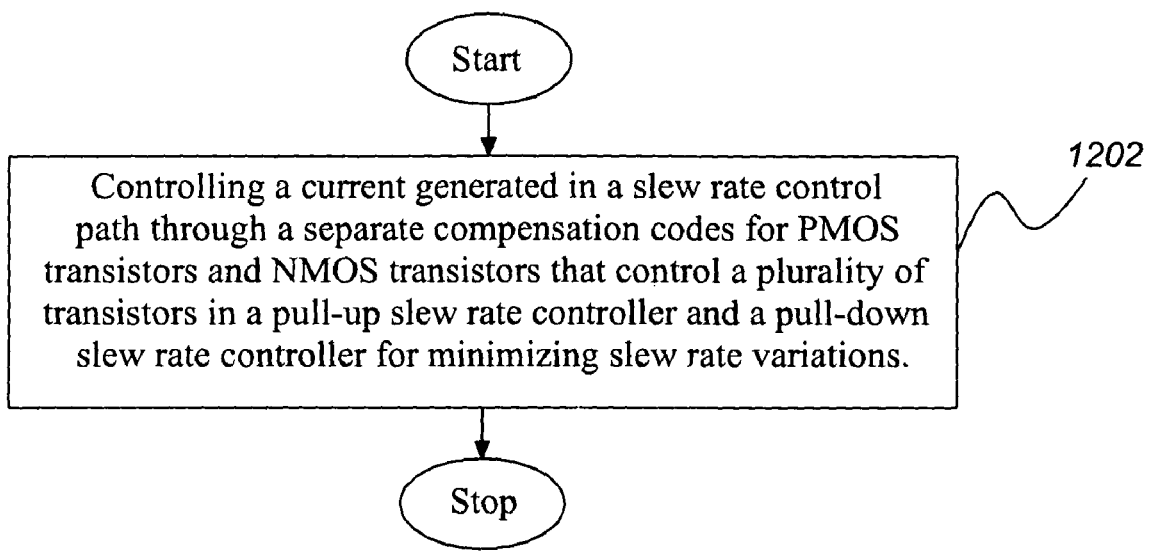
FIG. 12 illustrates a flow diagram of a method for minimizing slew rate variations through a compensated output buffer circuit according to the present invention.

FIG. 12 illustrates a flow diagram of a method for minimizing slew rate variations through a compensated output buffer circuit according to an embodiment of the present invention. At step 1202, a generated current is controlled in a slew rate control path through a separate compensation codes for PMOS transistors and NMOS transistors that control a plurality of transistors in said pull-up slew rate controller and said pull-down slew rate controller for minimizing slew rate variations.

The output buffer circuit as described in the present invention offers many advantages. The output buffer circuit according to the present invention is capable of minimizing the slew rate variations over the PVT range. Further, the present invention helps in maintaining the variation of the slew rate within a narrow band even for skewed process corners i.e. fast n-slow p and slow n-fast p. Since the pull-up slew rate for the PMOS output driver is controlled by PMOS transistors and the pull-down slew rate for the NMOS output driver is controlled by NMOS transistors only, the slew rate variation is minimized even on skewed process corners. The variation in the slew rate is more for the case where, for example, pull-up slew rate is simply controlled by NMOS transistors which are gate controlled by PMOS compensation codes.

Although the disclosure of circuit and method has been described in connection with the embodiment of the present invention illustrated in the accompanying drawings, it is not limited thereto. It will be apparent to those skilled in the art that various substitutions, modifications and changes may be made thereto without departing from the scope and spirit of the disclosure.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this present disclosure has described certain embodiments and generally associated methods, alterations and permutations of these embodiments and methods will be apparent to those skilled in the art. Accordingly, the above description of example embodiments does not define or constrain this present disclosure. Other changes, substitutions, and alterations are also possible without departing from the spirit and scope of this present disclosure, as defined by the following claims.

What is claimed is:

1. An output buffer system comprising:
a compensated output driver utilizing a separate compensation codes for at least one PMOS transistors and at least one NMOS transistors, said compensated output driver coupled to a first driving node, a second driving node and an output node, the compensated output driver having a pull-up driver section for driving said output node in response to a signal at the first driving node and a pull down driver section for driving said output node in response to a signal at the second driving node;
a compensated pull-up slew rate controller utilizing a separate compensation codes for the PMOS transistors and the NMOS transistors, said compensated pull-up slew rate controller connected between an input node and the compensated output driver through the first driving node for controlling a pull-up slew rate of the compensated output driver during a transition of an output from 0 to 1; and
a compensated pull-down slew rate controller utilizing a separate compensation codes for the PMOS transistors and the NMOS transistors, said compensated pull-down slew rate controller connected between the input node and the compensated output driver through the second driving node for controlling a pull-down slew rate of the compensated output driver during a transition of the output from 1 to 0 to minimize the variations in the current slew rate of the output buffer over process, voltage and temperature condition for improving the slew rate control.

2. A compensated output buffer circuit providing an improved slew rate control comprising:
a compensated output driver utilizing a separate compensation codes for PMOS transistors and NMOS transistors, said compensated output driver coupled to a first driving node, a second driving node and an output node, the compensated output driver having a pull-up driver section for driving said output node in response to a signal at the first driving node and a pull down driver section for driving said output node in response to a signal at the second driving node;
a compensated pull-up slew rate controller utilizing a separate compensation codes for PMOS transistors and NMOS transistors, said compensated pull-up slew rate controller controlling a pull-up slew rate of the compensated output driver comprising:

an inverter circuit coupled between an input node and the first driving node for inverting data of the input node and outputting an inverted data to the first driving node, the inverter circuit comprising a first PMOS transistor and a first NMOS transistor;

a first control signal generator coupled to the input node for generating a first control signal;

a second NMOS transistor operatively coupled between a first node and a ground voltage for switching, said second NMOS transistor being controlled by the first control signal;

a third NMOS transistor connected parallel to the second NMOS transistor, said third NMOS transistor operatively coupled between the first node and the ground voltage for discharging a parasitic capacitance developed at the first driving node;

a fourth NMOS diode transistor operatively coupled between a second node and the ground voltage;

means for generating a first current mirror for providing a proportionate current to a first slew rate control path;

a second PMOS transistor connected between the second node and a third node for switching, said second PMOS transistor being controlled by the first control signal; and a PMOS module coupled between a power supply and the third node, said module comprising a plurality of PMOS transistors for controlling a current in a slew rate control path formed by the first NMOS transistor and the third NMOS transistor;

a compensated pull-down slew rate controller utilizing a separate compensation codes for PMOS transistors and NMOS transistors, said compensated pull-down slew rate controller controlling a pull-down slew rate of the compensated output driver comprising:

an inverter circuit coupled between the input node and the second driving node for inverting data of the input node and outputting an inverted data to the second driving node, said inverter comprising a third PMOS transistor and a fifth NMOS transistor;

a second control signal generator coupled to the input node for generating a second control signal;

a fourth PMOS transistor connected between the power supply and a fourth node for switching, said fourth PMOS transistor being controlled by the second control signal;

a fifth PMOS transistor connected parallel to the fourth PMOS transistor, said fifth PMOS transistor operatively coupled between the power supply and the fourth node for charging a parasitic capacitance at the second driving node;

a sixth PMOS diode transistor connected between the power supply and a fifth node;

means for generating a second current mirror for providing a proportionate current to a second slew rate control path;

a sixth NMOS transistor connected between the fifth node and a sixth node for switching, said sixth NMOS transistor being controlled by the second control signal; and an NMOS module coupled between the sixth node and the ground voltage, said NMOS module comprising a plurality of NMOS transistors for controlling a current in a slew rate control path formed by the third PMOS transistor and the fifth PMOS transistor for improving the slew rate control.

3. The output buffer circuit of claim 2, wherein said first control signal generator comprises a NAND gate configured to receive complementary inputs for generating the first control signal.

4. The output buffer circuit of claim 2, wherein said second control signal generator comprises a NOR gate configured to receive complementary inputs for generating the second control signal.

5. The output buffer circuit of claim 2, wherein said first PMOS transistor having a source terminal connected to the power supply, a drain terminal connected to the first driving node and a gate terminal connected to the input node.

6. The output buffer circuit of claim 2, wherein said first NMOS transistor having a drain terminal connected to the drain terminal of the first PMOS transistor through the first driving node, a source terminal connected to the first node and a gate terminal connected to the gate terminal of the first PMOS transistor through the input node.

7. The output buffer circuit of claim 2, wherein said second NMOS transistor having a drain terminal connected to the source terminal of the first NMOS transistor through the first node, a source terminal connected to the ground voltage and a gate terminal configured to receive the first control signal.

8. The output buffer circuit of claim 2, wherein said third NMOS transistor having a drain terminal connected to the source terminal of the first NMOS transistor and the drain terminal of the second NMOS transistor through the first node, a source terminal connected to the ground voltage and a gate terminal connected to the second node.

9. The output buffer circuit of claim 2, wherein said fourth NMOS diode transistor having a drain terminal and a gate terminal connected to the gate terminal of the third NMOS transistor through the second node and a source terminal connected to the ground voltage.

10. The output buffer circuit of claim 2, wherein said second PMOS transistor having a source terminal connected to the third node, a drain terminal connected to the drain terminal, the gate terminal of the fourth NMOS transistor and the gate terminal of the third NMOS transistor through the second node and a gate terminal configured to receive the first control signal.

11. The output buffer circuit of claim 2, wherein said plurality PMOS transistor having source terminals connected to the power supply, drain terminals connected to the source terminal of the second PMOS transistor through the third node and gate terminals configured to receive a plurality of control signals.

12. The output buffer circuit of claim 2, wherein said third PMOS transistor having a source terminal connected to the fourth node, a drain terminal connected to the second driving node and a gate terminal connected to the input node.

13. The output buffer circuit of claim 2, wherein said fifth NMOS transistor having a drain terminal connected to the drain terminal of the third PMOS transistor through the second driving node, a source terminal connected to the ground voltage and a gate terminal connected to the gate terminal of the third PMOS transistor through the input node.

14. The output buffer circuit of claim 2, wherein said fourth PMOS transistor having a drain terminal connected to the source terminal of the third PMOS transistor through the fourth node, a source terminal connected to the power supply and a gate terminal configured to receive the second control signal.

15. The output buffer circuit of claim 2, wherein said fifth PMOS transistor having a drain terminal connected to the source terminal of the third PMOS transistor and the drain terminal of the fourth PMOS transistor through the fourth node, a source terminal connected to the power supply and a gate terminal connected to the fifth node.

16. The output buffer circuit of claim 2, wherein said sixth PMOS diode transistor having a drain terminal and a gate terminal connected to the gate terminal of the fifth PMOS transistor through the fifth node and a source terminal connected to the power supply.

17. The output buffer circuit of claim 2, wherein said sixth NMOS transistor having a source terminal connected to the sixth node, a drain terminal connected to the drain terminal and the gate terminal of the sixth PMOS transistor and the gate terminal of the fifth PMOS transistor through the fifth node and a gate terminal configured to receive the second control signal.

18. The output buffer circuit of claim 2, wherein said plurality NMOS transistor having drain terminals connected to the source terminal of the sixth NMOS transistor through the sixth node, source terminals connected to the ground voltage and gate terminals configured to receive a plurality of control signals.

19. A method for minimizing slew rate variations through a compensated output buffer circuit, said output buffer comprising a pull-up slew rate controller, a pull-down slew rate controller and a compensated output driver, said method comprising controlling a current generated in a slew rate control path through separate compensation codes for at least one PMOS transistors and at least one NMOS transistors that control a plurality of transistors in said pull-up slew rate controller and said pull-down slew rate controller for minimizing slew rate variations.

20. The method as claimed in claim 19, wherein said controlling comprises one of a charging and discharging of a parasitic capacitance.

21. The method of claim 20, wherein said discharging of the parasitic capacitance occurs during a signal transition from 0 to 1 at an input node.

22. The method of claim 20, wherein said charging of the parasitic capacitance occurs during a signal transition from 1 to 0 at an input node.

23. An output buffer, comprising:
a pull-up slew rate controller,
a pull-down slew rate controller coupled to the pull-up slew rate controller;
and a compensated output driver coupled to said pull-down slew rate controller, wherein said output buffer controls a plurality of transistors in said pull-up slew rate controller and said pull-down slew rate controller for minimizing slew rate variations, and wherein said output buffer controls a current generated in a slew rate control path through separate compensation codes for at least one PMOS transistors and at least one NMOS transistors.

24. The buffer as claimed in claim 23, wherein at least one of said controllers comprises one of a charging and discharging of a parasitic capacitance.

25. The buffer as claimed in claim 24, wherein said discharging of the parasitic capacitance occurs during a signal transition from 0 to 1 at an input node.

26. The buffer as claimed in claim 24, wherein said charging of the parasitic capacitance occurs during a signal transition from 1 to 0 at an input node.

* * * * *